(12) United States Patent
Kalandar et al.

(10) Patent No.: US 9,034,694 B1
(45) Date of Patent: May 19, 2015

(54) EMBEDDED DIE BALL GRID ARRAY PACKAGE

(71) Applicants: Navas Khan Oratti Kalandar, Petaling Jaya (MY); Boon Yew Low, Petaling Jaya (MY); Kesvakumar V. C. Muniandy, Klang (MY)

(72) Inventors: Navas Khan Oratti Kalandar, Petaling Jaya (MY); Boon Yew Low, Petaling Jaya (MY); Kesvakumar V. C. Muniandy, Klang (MY)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/191,448

(22) Filed: Feb. 27, 2014

(51) Int. Cl.
| | |
|---|---|
| H01L 21/44 | (2006.01) |
| H01L 21/48 | (2006.01) |
| H01L 21/50 | (2006.01) |
| H01L 23/00 | (2006.01) |
| H01L 23/29 | (2006.01) |
| H01L 21/56 | (2006.01) |
| H01L 23/28 | (2006.01) |

(52) U.S. Cl.
CPC .............. H01L 24/11 (2013.01); H01L 23/293 (2013.01); H01L 21/56 (2013.01); H01L 24/14 (2013.01); H01L 23/28 (2013.01); *H01L 2224/11002* (2013.01); *H01L 2924/01029* (2013.01)

(58) Field of Classification Search
CPC .................... H01L 2021/60022; H01L 21/78; H01L 23/49811; H01L 21/56
USPC .......................................................... 438/108
See application file for complete search history.

(56) References Cited

U.S. PATENT DOCUMENTS

| | | | |
|---|---|---|---|
| 5,216,278 | A | 6/1993 | Lin et al. |
| 5,637,920 | A | 6/1997 | Loo |
| 6,731,003 | B2 | 5/2004 | Joshi |
| 7,282,390 | B2 | 10/2007 | Tan et al. |
| 7,928,574 | B2 | 4/2011 | Abbott |
| 8,053,349 | B2 | 11/2011 | Rhyner et al. |
| 8,174,119 | B2 | 5/2012 | Pendse |
| 8,304,896 | B2 | 11/2012 | England |
| 2009/0127695 | A1 | 5/2009 | Kim et al. |
| 2010/0237477 | A1* | 9/2010 | Pagaila et al. ................. 257/660 |
| 2012/0306038 | A1* | 12/2012 | Chow et al. ................... 257/434 |
| 2015/0021754 | A1* | 1/2015 | Lin et al. ....................... 257/712 |

* cited by examiner

*Primary Examiner* — David S Blum
(74) *Attorney, Agent, or Firm* — Charles Bergere

(57) ABSTRACT

A method of assembling a semiconductor package includes attaching a semiconductor die to a frame having a strip or panel form. The semiconductor die has at least one stud bump. The die and the stud bump are covered with a first encapsulation material, and then at least a portion of the stud bump is exposed. At least one die conductive member is formed on the first encapsulation material and electrically coupled to the stud bump. The die conductive member is covered with a second encapsulation material, and then at least a portion of the die conductive member is exposed. At least one grid array conductive member is formed on the second encapsulation material and electrically coupled to the die conductive member. Finally, at least one solder ball is attached to the at least one grid array conductive member.

12 Claims, 5 Drawing Sheets

EMBEDDED DIE BALL GRID ARRAY PACKAGE

BACKGROUND OF THE INVENTION

The present invention is directed to semiconductor device packaging and, more particularly, to a method of assembling embedded semiconductor die ball grid array packages with a strip or panel form frame.

Fan-out wafer level packages (WLPs) have many advantages, including the provision of a high-number of input/output (I/O) terminals with a smaller package footprint and without wasting valuable silicon real estate on the active die. However, the assembly process is capital intensive and tends to result in packages having a relatively high profile. One of the conventional steps of an assembly process for a fan-out WLP is a spin-on technique for applying a dielectric material. This technique increases the cost because round components are needed for the spin-on processing to effectively embed the die and other components. Spin-on processes are also inefficient with respect to area.

It is therefore desirable to provide a method of assembling low profile semiconductor packages having the advantages of a fan-out WLP.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale. Notably, certain vertical dimensions have been exaggerated relative to certain horizontal dimensions.

DETAILED DESCRIPTION OF THE INVENTION

Figure 1:
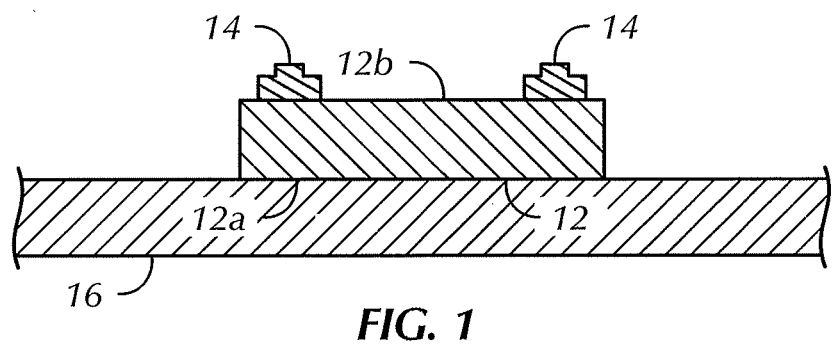
FIG. 1 is a cross-sectional side elevational view of a semiconductor die attached to a frame in strip or panel form in accordance with a first preferred embodiment of the present invention.

Referring to the drawings, wherein the same reference numerals are used to designate the same components throughout the several figures, there is shown in FIGS. 1-6 a first preferred embodiment of a method for manufacturing a semiconductor package 10 in accordance with the invention. A semiconductor die 12 is provided having opposing first and second main surfaces 12a, 12b. The semiconductor die 12 is typically in the form of an integrated circuit (IC) or the like. The semiconductor die 12 may be made from any semiconductor material or combinations of materials, such as gallium arsenide, silicon germanium, silicon-on-insulator (SOI), silicon, monocrystalline silicon, or the like, and combinations of the above.

At least one stud bump 14 (and preferably more than one stud bump 14) is preferably formed on the second main surface 12b (which is preferably the active surface) of the semiconductor die 12. The stud bumps 14, which are spaced apart, are preferably formed of a copper (Cu) material. However, other conductive materials, such as gold (Au) or the like, may be used as well. The use of stud bumps 14 is advantageous for electrical connection to the semiconductor die 12 because metallization of pads (not shown) on the semiconductor die 12 is not required, as the stud bumps 14 (unlike solder) are compatible with aluminum, the common material used for the pads. The use of stud bumps 14 thereby reduces manufacturing steps and cost, and also creates more reliable and lower cost connections than conventional methods.

The stud bumps 14 may be formed by a conventional technique, wherein shaped metallic material is bonded to each of the pads on the second main surface 12b of the semiconductor die 12, in a manner similar to wire bonding, but the wires (not shown) are each cut closely above the bonded material to form the studs.

The first main surface 12a of the semiconductor die 12 is preferably attached to a support frame 16, which is preferably in a strip or panel form. That is, the frame 16 is configured to receive a plurality of semiconductor dies 12 mounted in a row or in a matrix, as is conventionally known for testing of dies 12. The frame 16 is preferably made from steel or copper, although other types of metal or polymer materials may be used as well. The semiconductor die 12 is preferably bonded to the frame 16 using an adhesive, such as an epoxy material. However, other methods of securing the semiconductor die 12 to the frame 16 may be used, such as mechanical or other fasteners or the like.

Figure 2:
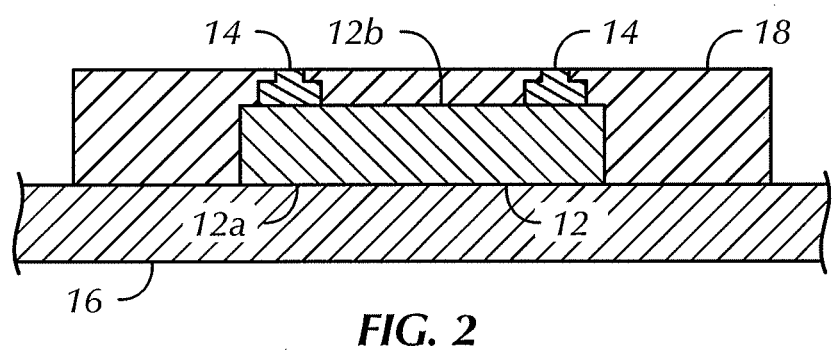
FIG. 2 is a cross-sectional side elevational view of the structure of FIG. 1 following encapsulation and exposure of stud bumps on the semiconductor die.

Referring to FIG. 2, the semiconductor die 12 and the stud bumps 14 are preferably molded in a first encapsulation material 18. The first encapsulation material 18 is preferably an epoxy, although any other suitable dielectric material may be used as well. At least a portion of the peripheral portion of each of the stud bumps 14 is exposed through the first encapsulation material 18. The stud bumps 14 are preferably exposed by grinding or etching a portion of the first encapsulation material 18 following the molding. The first encapsulation material 18 may be selectively ground or etched, or the entire surface of the first encapsulation material 18 may be ground or etched until the peripheral portion of each of the stud bumps 14 is exposed. However, it is also contemplated that peripheral portions of the stud bumps 14 may be left exposed by a selective molding process.

Figure 3:
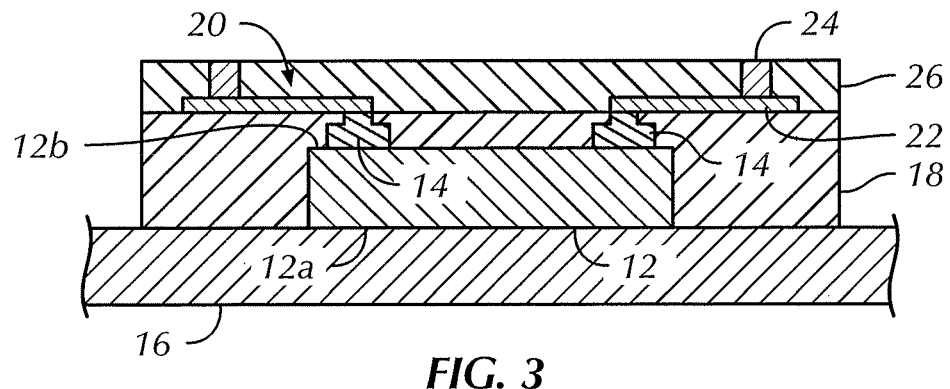
FIG. 3 is a cross-sectional side elevational view of the structure of FIG. 2 following formation of die conductive members and encapsulation and exposure thereof.

Referring to FIG. 3, one or more die conductive members 20 are formed on the first encapsulation material 18 and are each electrically coupled to respective ones of the stud bumps 14. In the first preferred embodiment, each die conductive member 20 is formed by a trace 22 and a post 24 coupled thereto. The trace 22 preferably extends beyond a peripheral edge of the semiconductor die 12 in plan view, and the post 24 preferably extends from a radial outer edge of the trace 22 away from the semiconductor die 12. However, other configurations for the die conductive members 20 may be used as well.

Each die conductive member 20 is preferably formed via electroless copper seeding, tracing, and/or plating techniques. While the die conductive members 20 are preferably primarily formed of copper (Cu), the die conductive members 20 may also be plated with a metal layer or layers (not shown) such as silver (Ag), gold (Au), nickel (Ni), palladium (Pd), tin (Sn), or the like. Other techniques for forming the die conductive members 20 on the first encapsulation material 18, such as attachment of pre-formed conductors or the like, may also be used.

Each die conductive member 20 is thereafter molded in a second encapsulation material 26, which is preferably an epoxy, although any other suitable dielectric material may be used as well. The second encapsulation material 26 may be different from the first encapsulation material 18, although it is preferred that the same material is used for both layers 18, 26. At least a portion of each of the die conductive members 20 is exposed through the second encapsulation material 26. In particular, at least a portion of the post 24 of each die conductive member 20 is preferably exposed such that the post 24 essentially forms a via electrically connected back to a corresponding stud bump 14 by the trace 22.

The die conductive members 20 are preferably exposed by grinding or etching the second encapsulation material 26 following the molding. The second encapsulation material 26 may be selectively ground or etched, or the entire surface of the second encapsulation material 26 may be ground or etched until the die conductive members 20 are exposed. However, it is also contemplated that portions of the die conductive members 20 may be left exposed by a selective molding process.

Figure 4:
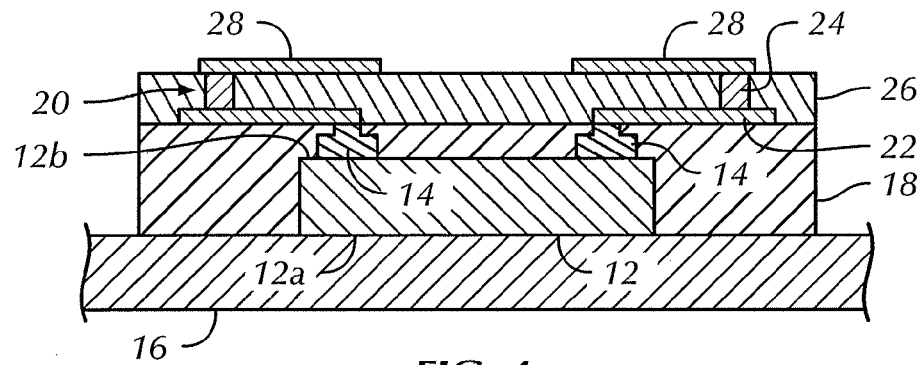
FIG. 4 is a cross-sectional side elevational view of the structure of FIG. 3 following formation of grid array conductive members.

Referring to FIG. 4, one or more grid array conductive members 28 are formed on the second encapsulation material 26 and are each electrically coupled to respective ones of the die conductive members 20. In the first preferred embodiment, each grid array conductive member 28 is formed as a trace on the surface of the second encapsulation material 26, extending from the post 24 of the die conductive member 20 back toward a center of the semiconductor die 12. However, other configurations for the grid array conductive members 28 may be used as well. The die conductive members 20 and grid array conductive members 28 may be either directly or indirectly electrically coupled to one another.

Each grid array conductive member 28 is preferably formed via electroless copper seeding, tracing, and/or plating techniques. While the grid array conductive members 28 are preferably primarily formed of copper (Cu), the grid array conductive members 28 may also be plated with a metal layer or layers (not shown) such as silver (Ag), gold (Au), nickel (Ni), palladium (Pd), tin (Sn), or the like. Other techniques for forming the grid array conductive members 28 on the second encapsulation material 26, such as attachment of pre-formed conductors or the like, may also be used.

Figure 5:
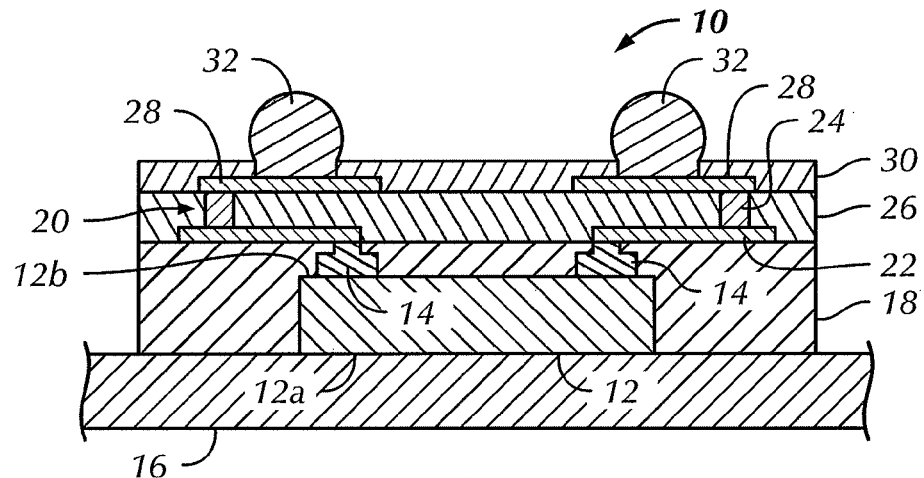
FIG. 5 is a cross-sectional side elevational view of the structure of FIG. 4 following solder mask and solder ball formation.

Referring to FIG. 5, a solder mask 30 is preferably formed on the second encapsulation material 26 and portions of the grid array conductive members 28. The solder mask 30 is preferably formed from a resist, epoxy, or other dielectric material, and may be applied in a liquid or film form. Portions of the grid array conductive members 28 may be exposed by selective etching of the solder mask 30 in the locations of the desired openings. Alternatively, the solder mask 30 may be selectively applied to leave the portions of the grid array conductive members 28 uncovered.

Thereafter a conventional attachment process may be used to attach one or more solder balls 32 to each of the grid array conductive members 28. The solder balls 32 are in electrical communication with respective stud bumps 14 via the die and grid array conductive members 20, 28. Preferably, the solder balls 32 have a greater pitch than the stud bumps 14, allowing the electrical connections to the semiconductor die 12 to fan out.

Figure 6:
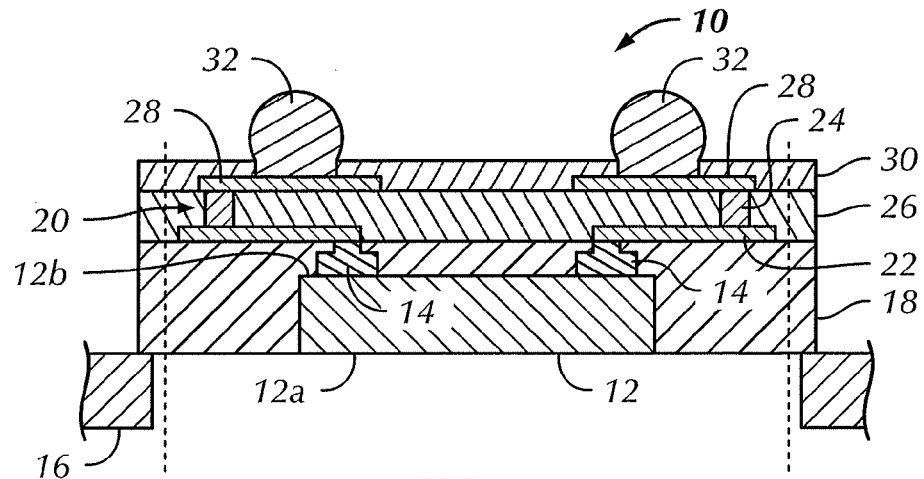
FIG. 6 is a cross-sectional side elevational view of the structure of FIG. 5 following removal of a portion of the frame.

Referring to FIG. 6, portions of the frame 16 may optionally be removed to expose the first main surface 12a of the semiconductor die 12. Removal may be performed by etching, grinding, or the like. Singulation along the lines shown in FIG. 6 may be performed to separate the dies 12 upon completion. Preferably the singulation occurs within the window created by etching the frame 16 to allow for easier processing.

Figure 7:
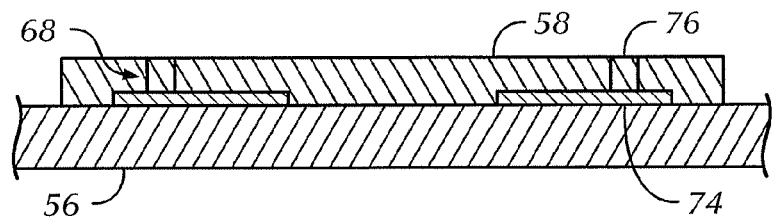
FIG. 7 is a cross-sectional side elevational view of a frame having grid array conductive members formed thereon which are encapsulated and exposed in accordance with a second preferred embodiment of the present invention.

There is shown in FIGS. 7-11 a second preferred embodiment of a method for manufacturing a semiconductor package 50 in accordance with the invention. In FIG. 7, the support frame 56 is provided in strip or panel form. At least one, and preferably more than one, grid array conductive member 68 is formed on a surface of the frame 56. The grid array conductive members 68 are preferably formed via electroless copper seeding, tracing, and/or plating techniques, as described above. In the second embodiment, the copper is preferably applied directly on the frame 56 surface to form a trace 74 and a post 76 coupled thereto. The trace 74 preferably extends along the frame 56 and the post 76 preferably extends from proximate a radial outer edge of the trace 74 and away from the surface of the frame 56. However, other configurations for the grid array conductive members 68 may be used as well.

The grid array conductive members 68 are preferably molded in a first encapsulation material 58, which is preferably an epoxy, although any other suitable dielectric material may be used as well. At least a portion of each of the grid array conductive members 68, preferably the posts 76, is exposed through the first encapsulation material 58. The grid array conductive members 68 are preferably exposed by grinding or etching the first encapsulation material 58 following the molding. The first encapsulation material 58 may be selectively ground or etched, or the entire surface of the first encapsulation material 58 may be ground or etched until the portions of the grid array conductive members 68 are exposed. However, it is also contemplated that portions of the grid array conductive members 68 may be left exposed by a selective molding process.

Figure 8:
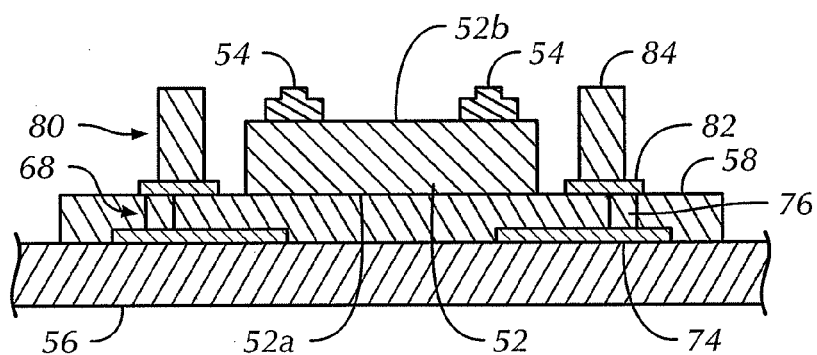
FIG. 8 is a cross-sectional side elevational view of the structure of FIG. 7 following attachment of a semiconductor die and formation of intermediate conductive members.

Referring to FIG. 8, a semiconductor die 52 is attached to the first encapsulation material 58.

Specifically, a first main surface 52a of the semiconductor die 52 may be attached to the first encapsulation material 58 using an adhesive, such as an epoxy material, although other methods of attachment may be used as well. As before, preferably stud bumps 54 are arranged on a second main surface 52b opposite the first main surface 52a of the semiconductor die 52.

One or more intermediate conductive members 80 are preferably also formed on the first encapsulation material 58 proximate the semiconductor die 52. The intermediate conductive members 80 are preferably formed via electroless copper seeding, tracing, and/or plating techniques, as described above, and are each placed in electrical contact with the exposed portion of a corresponding grid array conductive member 68. Each intermediate conductive element 80 is preferably formed by a trace 82 and a post 84 coupled thereto. The trace 82 of the intermediate conductive member 80 preferably extends from the exposed portion of the post 76 of the respective grid array conductive member 68 along the surface of the first encapsulation material 58 toward the semiconductor die 52. The post 84 is preferably positioned near a center of the trace 82 and extends away from the first encapsulation material 58 so that the peripheral surface is generally coplanar with the peripheral surfaces of the stud bumps 54. However, other configurations for the intermediate conductive members 80 may be used as well.

Figure 9:
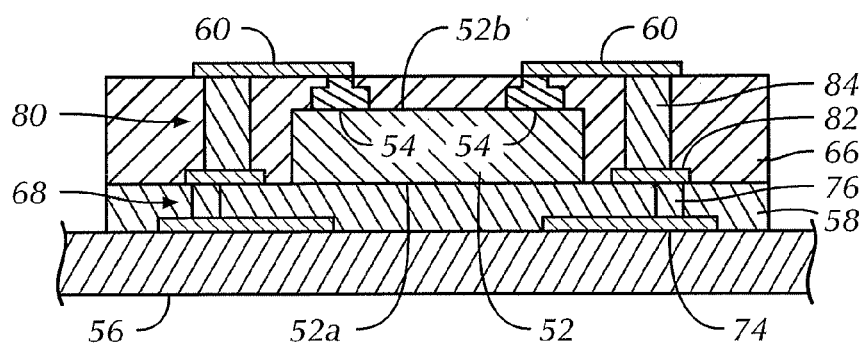
FIG. 9 is a cross-sectional side elevational view of the structure of FIG. 8 following encapsulation, exposure of the intermediate conductive members and the stud bumps on the semiconductor die, and connection thereof by die conductive members.

Referring to FIG. 9, the semiconductor die 52, the stud bumps 54, and the intermediate conductive members 80 are thereafter molded in a second encapsulation material 66, which is preferably an epoxy, although any other suitable dielectric material may be used as well. The second encapsulation material 66 may be different from the first encapsulation material 58, although it is preferred that the same material is used for both layers 58, 66. At least a peripheral portion of each of the intermediate conductive members 80 and a peripheral portion of each of the stud bumps 54 are exposed through the second encapsulation material 66. As before, these portions may be exposed through grinding or etching the second encapsulation material 66, although a selective molding process can be used instead.

One or more die conductive members 60 are formed on the second encapsulation material 66 and are each electrically coupled to respective ones of the intermediate conductive members 80 and the stud bumps 54. In the second preferred embodiment, the die conductive members 60 are formed as traces on the surface of the second encapsulation material 66, extending from the exposed peripheral portion of the post 84 of the intermediate conductive member 80 to the exposed peripheral portion of the adjacent stud bump 54. However, other configurations for the die conductive member 60 may be used as well. In the configuration of FIG. 9, the die conductive members 60 are indirectly electrically coupled to the grid array conductive members 68 by the intermediate conductive members 80. The die conductive members 68 are preferably formed as before via electroless copper seeding, tracing, and/or plating techniques.

Figure 10:
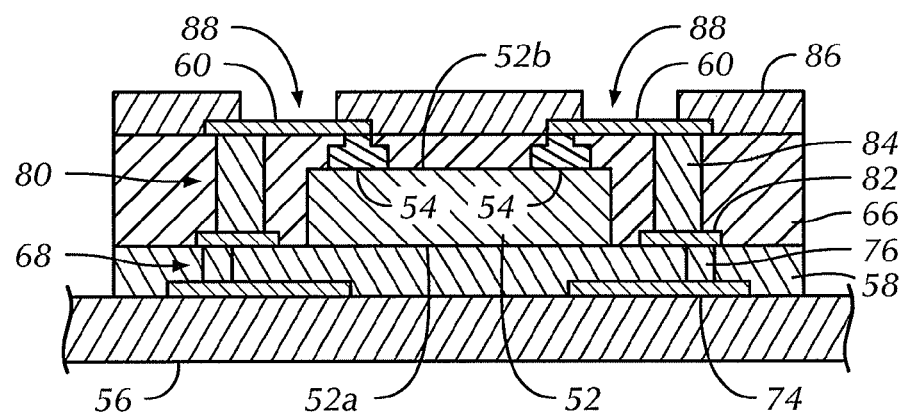
FIG. 10 is a cross-sectional side elevational view of the structure of FIG. 9 following formation of a solder mask on portions of the die conductive members.

Referring to FIG. 10, a first solder mask 86 may be applied over the second encapsulation material 66 and the die conductive members 60. If desired, openings 88 may be formed in the first solder mask 86 (either by subsequent etching or selective molding) over portions of the die conductive members 60 to allow for electrical connection to additional components (not shown).

Figure 11:
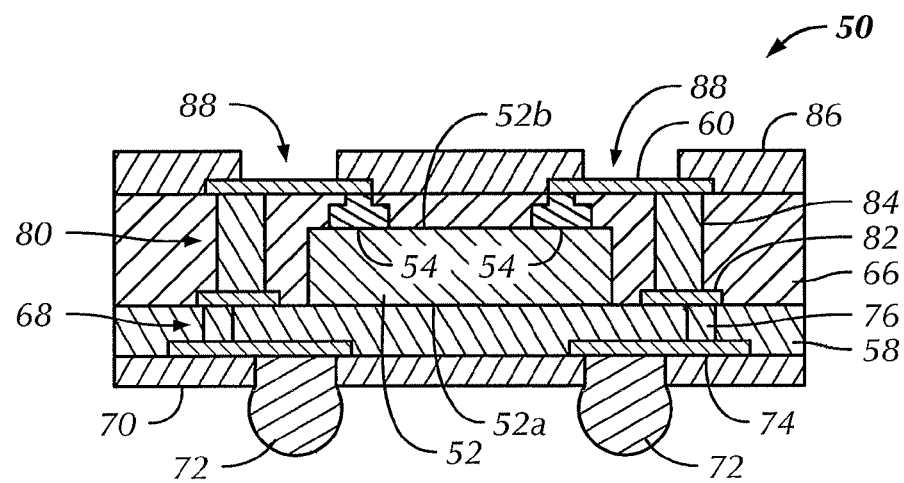
FIG. 11 is a cross-sectional side elevational view of the structure of FIG. 10 following removal of the frame and solder mask and solder ball formation on the grid array conductive members.

Referring to FIG. 11, the frame 56 is preferably removed from the first encapsulation material 58 and the grid array conductive members 68. The removal is preferably performed by etching or grinding. A second solder mask 70 is thereafter preferably formed on the first encapsulation material 58 and portions of the grid array conductive members 68. Portions of the grid array conductive members 68 may be exposed by selective etching of the second solder mask 70 in the locations of the desired openings. Alternatively, the second solder mask 70 may be selectively applied to leave the portions of the grid array conductive members 68 uncovered.

Thereafter a conventional attachment process may be used to attach solder balls 72 to each of the grid array conductive members 68. The solder balls 72 are in electrical communication with respective stud bumps 54 via the die, intermediate, and grid array conductive members 60, 80, 68. Preferably, the solder balls 72 have a greater pitch than the stud bumps 54, allowing the electrical connections to the semiconductor die 52 to fan out.

Figure 12:
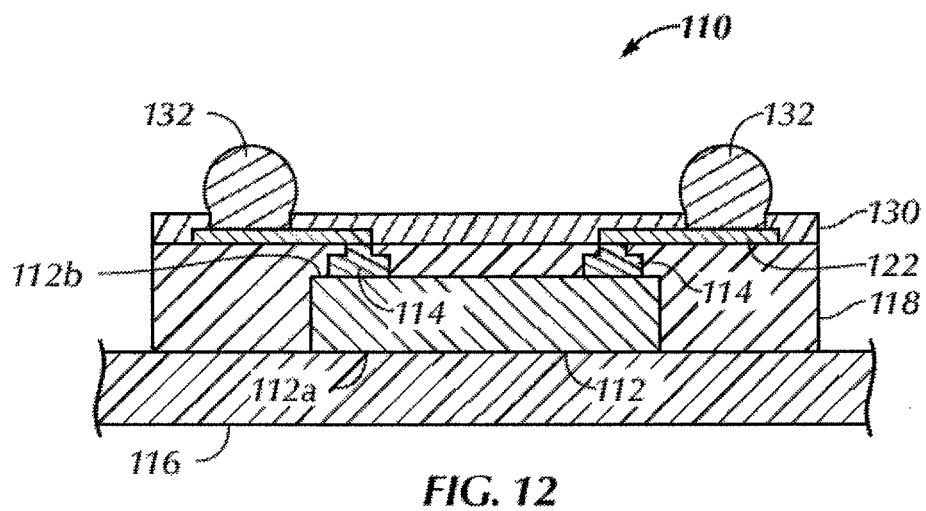
FIG. 12 is a cross-sectional side elevational view of a package in accordance with a third preferred embodiment of the present invention.
Figure 13:
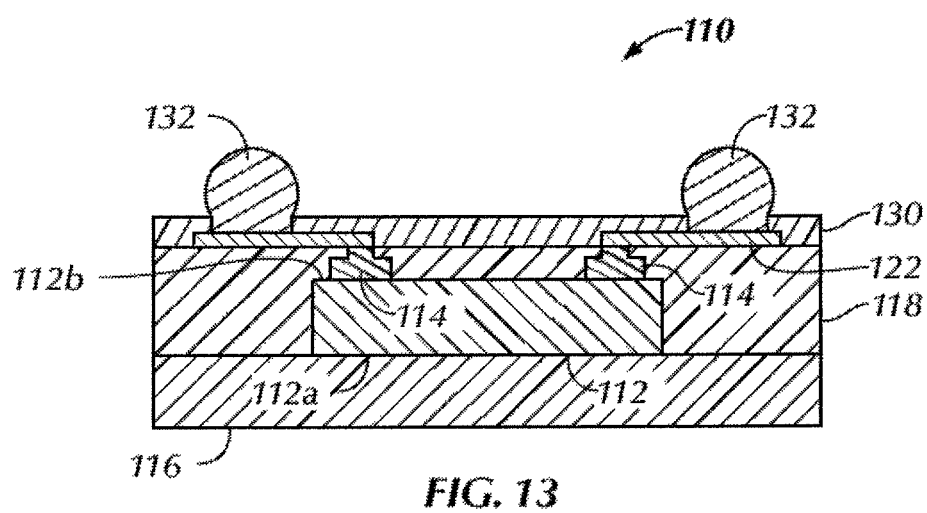
FIG. 13 is a cross-sectional side elevational view of the package of FIG. 12 following etching of the frame.

FIGS. 12 and 13 show a third preferred embodiment of a method for manufacturing a semiconductor package 110 in accordance with the invention. The method shown of the third preferred embodiment is similar to the method of the first preferred embodiment. Therefore, like numerals have been used for like elements, except the 100 series numerals have been used for the third embodiment. Accordingly, a complete description of the third embodiment has been omitted, with only the differences being described.

The package 110 shown in FIG. 12 is assembled in much the same way as the package 10 of FIGS. 1-6. However, in the third preferred embodiment, the second encapsulation material and the grid array conductive members are omitted. As a result, solder balls 132 are preferably directly electrically connected to the die conductive members 122, each of which is preferably only a trace formed on the first encapsulation material 118 and electrically coupled to a respective stud bump 114. A solder mask 130 is preferably formed over the first encapsulation material 118 and the die conductive members 122, with openings formed therein (as described above) to allow connection to the solder balls 132.

In FIG. 13, the frame 116 is etched such that a portion of the frame 116 remains attached to the first main surface 112a of the semiconductor die 112 and to the first encapsulation layer 118. The remaining portion of the frame 116, which is preferably made from copper (although other heat conducting metal or polymeric material may be used as well), serves as a heat spreader for the package 110.

In the foregoing specification, the invention has been described with reference to specific examples of embodiments of the invention. It will, however, be evident that various modifications and changes may be made therein without departing from the broader spirit and scope of the invention as set forth in the appended claims.

Those skilled in the art will recognize that boundaries between the above-described operations are merely illustrative. The multiple operations may be combined into a single operation, a single operation may be distributed in additional operations and operations may be executed at least partially overlapping in time. Further, alternative embodiments may include multiple instances of a particular operation, and the order of operations may be altered in various other embodiments.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

In the claims, the word 'comprising' or 'having' does not exclude the presence of other elements or steps then those listed in a claim. Further, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:

1. A method of assembling a semiconductor package, the method comprising:
    attaching a first main surface of a semiconductor die to a frame having one of a strip or panel form, the semiconductor die having a second main surface opposite to the first main surface and at least one stud bump formed on the second main surface;
    molding the semiconductor die and the at least one stud bump in a first encapsulation material;
    exposing at least a portion of the at least one stud bump through the first encapsulation material;
    forming at least one die conductive member on the first encapsulation material and electrically coupled to the at least one stud bump;
    molding the at least one die conductive member in a second encapsulation material;
    exposing at least a portion of the at least one die conductive member through the second encapsulation material;
    forming at least one grid array conductive member on the second encapsulation material, wherein the grid array conductive member is electrically coupled to the at least one die conductive member; and
    attaching at least one solder ball to the at least one grid array conductive member.

2. The method of claim 1, wherein the exposing of the at least a portion of the at least one stud bump and the at least one die conductive member are performed by respectively grinding portions of the first and second encapsulation materials.

3. The method of claim 1, wherein at least one of the first and second encapsulation materials is an epoxy.

4. The method of claim 1, further comprising forming a solder mask on the second encapsulation material and portions of the at least one grid array conductive member prior to the attachment of the at least one solder ball.

5. The method of claim 1, wherein the at least one die conductive member and the at least one grid array conductive member are formed by electroless copper plating and tracing.

6. The method of claim 1, further comprising removing a portion of the frame to expose the first main surface of the semiconductor die.

7. A method of assembling a semiconductor package, the method comprising:
    forming at least one grid array conductive member on a frame having one of a strip or panel form;
    molding the at least one grid array conductive member in a first encapsulation material;
    exposing at least a portion of the at least one grid array conductive member through the first encapsulation material;
    attaching a first main surface of a semiconductor die to the first encapsulation material, the semiconductor die having a second main surface opposite to the first main surface and at least one stud bump formed on the second main surface;
    forming at least one intermediate conductive member on the first encapsulation material, wherein the intermediate conductive member is electrically coupled to the at least one grid array conductive member;
    molding the semiconductor die, the at least one stud bump, and the at least one intermediate conductive member in a second encapsulation material;
    exposing at least a portion of the at least one stud bump and the at least one intermediate conductive member through the second encapsulation material;
    forming at least one die conductive member on the second encapsulation material and electrically coupled to the at least one stud bump and the at least one intermediate conductive member;
    removing the frame from the first encapsulation material and the at least one grid array conductive member; and
    attaching at least one solder ball to the at least one grid array conductive member.

8. The method of claim 7, wherein the exposing of the at least a portion of the at least one grid array conductive member, the at least one stud bump, and the at least one intermediate conductive member are performed by respectively grinding portions of the first and second encapsulation materials.

9. The method of claim 7, wherein at least one of the first and second encapsulation materials is an epoxy.

10. The method of claim 7, further comprising forming a solder mask on the first encapsulation material and portions of the at least one grid array conductive member after removal of the frame and prior to the attachment of the at least one solder ball.

11. The method of claim 7, wherein the at least one grid array conductive member, the at least one intermediate conductive member, and the at least one die conductive member are formed by electroless copper plating and tracing.

12. A method of assembling a semiconductor package, the method comprising:
    attaching a first main surface of a semiconductor die to a frame having one of a strip or panel form, wherein the semiconductor die has a second main surface opposite to the first main surface and at least one stud bump formed on the second main surface;
    molding the semiconductor die and the at least one stud bump in a first encapsulation material;
    exposing at least a portion of the at least one stud bump through the first encapsulation material;
    forming at least one die conductive member on the first encapsulation material and electrically coupled to the at least one stud bump;
    forming a solder mask over the first encapsulation layer and the at least one die conductive member;
    exposing at least a portion of the at least one die conductive member through the solder mask; and
    attaching at least one solder ball to the at least one die conductive member.

* * * * *